(12) United States Patent
Melchior et al.

(10) Patent No.: US 6,250,820 B1
(45) Date of Patent: Jun. 26, 2001

(54) ELECTROOPTICAL COUPLING COMPONENT

(75) Inventors: Lutz Melchior, Berlin; Volker Plickert, Brieselang, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/386,038

(22) Filed: Aug. 30, 1999

Related U.S. Application Data

(63) Continuation of application No. PCT/DE98/00588, filed on Feb. 27, 1998.

(30) Foreign Application Priority Data

Feb. 28, 1997 (DE) .............................................. 197 09 842

(51) Int. Cl.$^7$ .................................................................. G02B 6/36
(52) U.S. Cl. ............................... 385/89; 385/92; 385/137
(58) Field of Search .................................. 385/89, 94, 88, 385/92, 93, 137

(56) References Cited

U.S. PATENT DOCUMENTS

| | | | |
|---|---|---|---|
| 5,163,113 | 11/1992 | Melman | 385/31 |
| 5,432,878 | * 7/1995 | Smous | 385/52 |
| 5,535,296 | 7/1996 | Uchida | 385/89 |
| 5,574,811 | * 11/1996 | Bricheno et al. | 385/52 |

FOREIGN PATENT DOCUMENTS

| | | |
|---|---|---|
| 0699931A1 | 3/1996 | (EP) . |
| 0713112A1 | 5/1996 | (EP) . |

OTHER PUBLICATIONS

"Photonic Interconnections: More Bandwidth, Less Real Estate", Eric R. Fossum, Photonics Spectra, May 1987, pp. 151–157.

Japanese Patent Abstract No. 07162098 (Kazunori), dated Jun. 23, 1995.

* cited by examiner

*Primary Examiner*—Rodney Bovernick
*Assistant Examiner*—Ellen E. Kim
(74) *Attorney, Agent, or Firm*—Herbert L. Lerner; Laurence A. Greenberg; Werner H. Stemer

(57) ABSTRACT

A coupling component includes a first substrate with a first alignment device and a plurality of optical waveguides located in one plane. The first substrate is a molded synthetic material body. The optical waveguides have coupling-side end surfaces causing a beam deflection onto optically active surfaces of a multichannel electrooptical converter. A second substrate has a second alignment device tuned or matched to the first alignment device of the first substrate. The converter is positioned on the second substrate independently of the optical waveguides and precisely with respect to the second alignment device. The alignment devices are formed by corresponding oblique surfaces on both substrates. The oblique surfaces in one dimension extend parallel to the longitudinal axes of the optical waveguides and are located in planes which intersect the plane of the optical waveguides. The oblique surfaces effect a form-locking engagement, as a result of which the end surfaces are laterally adjusted relative to the optically active surfaces.

7 Claims, 2 Drawing Sheets

ELECTROOPTICAL COUPLING COMPONENT

CROSS-REFERENCE TO RELATED APPLICATION

This application is a continuation of copending International Application No. PCT/DE98/00588, filed Feb. 27, 1998, which designated the United States.

BACKGROUND OF THE INVENTION

Field of the Invention

The invention is in the field of multichannel electrooptical connections and relates to an electrooptical coupling component, including a first substrate with a first alignment device and a plurality of optical waveguides located in one plane and having coupling-side end surfaces causing a beam deflection to optically active surfaces of a multichannel electrooptical converter, the optically active surfaces oriented toward the optical waveguides, and a second substrate with a second alignment device tuned or matched to the first alignment device of the first substrate, the electrooptical converter positioned on the second substrate independently of the optical waveguides and precisely with respect to the second alignment device.

Within the scope of the invention, an optical waveguide is understood to mean any device for carrying an optical signal in a three-dimensionally defined, guided way, especially ready-made optical waveguides and so-called fiber optics. In addition, an electrooptical converter is understood as both a transmitting and a receiving element (for instance light emitting diodes, surface emitting laser diodes, and photo diodes), in which the optically active surface of the converter for a transmitter is a light-emitting surface, while for a receiver it is a light-sensitive surface.

An optical transmitting and receiving device with a first substrate is known from European Patent Application EP 0 713 112 A1. A transmitter element is disposed on the first substrate in a recess. A second substrate is provided with a groove, in order to receive an optical waveguide on its lower surface. The optical waveguide ends at a protrusion having a triangular cross section that extends crosswise to the groove. The protrusion divides the groove from a recess on a lower surface of the second substrate. The two substrates are disposed on opposed sides of an intermediate body. The first substrate has its transmitter element facing a lower surface of the second substrate. Coupling of the optical waveguide to the transmitter element is accomplished by reflection of the beam, emitted by the transmitter element, from one side of the protrusion. A lens that focuses the beam is additionally provided on the intermediate body for adequate coupling efficiency. The alignment of the two substrates with one another is carried out through the use of adjusting balls, which cooperate with indentations in the intermediate body and in the substrate. The transmitting and receiving device is complicated to produce because the adjustment balls have to be manipulated as separate elements, and it involves losses because the beam has to penetrate the intermediate body.

An article entitled "Photonic Interconnections: More Bandwidth, Less Real Estate" by Eric R. Fossum, in PHOTONICS SPECTRA, May 1987, pages 151–157, describes an electrooptical coupling component with a first silicon substrate into which V-shaped grooves are etched. Ends of optical waveguides placed in the grooves are polished obliquely along with an end surface of the silicon substrate. Radiation guided in the ends of the optical waveguides reaches planar-structured optical receivers by way of the thus-formed oblique end surfaces. The lateral adjustment of the optical waveguides with respect to the receivers that is required for high coupling efficiency, is comparatively complicated and expensive and is not described in detail in that article.

U.S. Pat. No. 5,535,296 describes an electrooptical coupling component with a bottom substrate, on which a first substrate with a plurality of optical waveguides disposed in the same plane and a second substrate with electrooptical converters, are disposed. The two substrates are aligned with one another with the aid of two alignment pins, which are introduced into precision-made openings of the first substrate. The row in the second substrate is dimensioned to fit the clearance between the two pins exactly. The beam path extends in a straight line between the ends of the optical waveguides and the associated optically active surfaces of the converters.

An electrooptical coupling component of the type defined at the outset is found in European Patent Application EP 0 699 931 A1. A first substrate includes optical waveguides having end surfaces that are beveled. An electrooptical converter is mounted on a second substrate in such a way that the optically sensitive surfaces of the converter face away from the second substrate. Beams emitted by the converter are coupled-in by total reflection from the end surface of the respectively associated optical waveguide. Metallizings corresponding to one another are provided both on the first and the second substrates and on the converter and the second substrate for jointly aligning the converter in the first substrate. The metallizings are disposed in such a way that if corresponding metallizings are superimposed congruently, the optical waveguides and converters are aligned with one another. The surface tension of solder that moistens the metallizings is utilized and the solder liquefies upon assembly and then solidifies. The incident thermal strains can cause a misadjustment after the two substrates have been assembled.

SUMMARY OF THE INVENTION

It is accordingly an object of the invention to provide an electrooptical coupling component, which overcomes the hereinafore-mentioned disadvantages of the heretofore-known devices of this general type and which allows simple, tension-free adjustment of optical waveguides and converters to one another.

With the foregoing and other objects in view there is provided, in accordance with the invention, an electrooptical coupling component, comprising a first substrate formed as a molded synthetic-material body having a first alignment device formed by oblique surfaces; a second substrate having a second alignment device matched or tuned to the first alignment device and formed by oblique surfaces corresponding to the oblique surfaces of the first alignment device; a plurality of optical waveguides disposed in one given plane on the first substrate and having coupling-side end surfaces and longitudinal axes; and a multichannel electrooptical converter positioned on the second substrate independently of the optical waveguides and precisely relative to the second alignment device, the multichannel electrooptical converter having optically active surfaces oriented toward the coupling-side end surfaces of the optical waveguides; the coupling-side end surfaces of the optical waveguides causing a beam deflection to the optically active surfaces of the multichannel electrooptical converter; the oblique surfaces having one dimension extended parallel to the longitudinal axes of the optical waveguides, the oblique surfaces located in planes intersecting the given plane of the optical waveguides, and the oblique surfaces form-lockingly engaged with each other for laterally adjusting the end surfaces of the optical waveguides relative to the optically active surfaces of the multichannel electrooptical converter. A form-locking connection is one which connects two elements together due to the shape of the elements themselves, as opposed to a force-locking connection, which locks the elements together by force external to the elements.

According to the invention, the alignment of the optical waveguide and converter to one another is accomplished by the mechanical interaction of the surfaces corresponding to one another on the substrates. The configuration of the invention advantageously makes do without separate, additional adjusting bodies. The form-locking engagement of the surfaces brings about the alignment of the two substrates with one another, at least in two dimensions. The surfaces allow only a relative freedom of motion of the first substrate with respect to the second substrate in the longitudinal direction of the optical waveguides. Through the use of an additional stop on the second substrate, for instance, the first substrate is also positioned with this same degree of freedom. Once the substrates have been joined and aligned they are preferably durably joined together by an adhesive. Thermal strains in this assembly operation are avoided and cannot cause misadjustment of the two substrates.

The converter is preadjusted with respect to the oblique surfaces on the second substrate and is solidly joined to this substrate. The heat loss that occurs in converters, such as in laser diodes with a vertical resonator, is dissipated by way of a large-area contact of the converter with the second substrate. The first substrate is made from a synthetic or plastic, for instance using unmolding techniques, with the requisite precision, the oblique surface is disposed on the first substrate and the optical waveguides are in a three-dimensionally defined configuration relative to one another. The alignment of the optical waveguides with respect to the surfaces located on the first substrate, on one hand, and the alignment of the converter with respect to the surfaces disposed on the second substrate, on the other hand, are selected in such a way that once the two substrates have been joined together, the optical waveguides and the converters are aligned with one another, an optical signal coupling takes place by reflection from the incline. The positioning of the converter and the optical waveguide on the respective substrate can be carried out, for instance, by high-precision mechanical deposition, solder bumps, or mechanical molded and stop elements, all of which are known per se. The signal carried in the optical waveguide can be totally reflected from the surface of the optical waveguide and deflected toward the converter.

A further advantage of the configuration according to the invention is that the two substrates can be mounted separately as partial components and can be tested independently of one another before the final assembly. A defective partial component therefore does not lead to a defective complete component that is not detectable until after assembly.

In accordance with another feature of the invention, there is provided a prismatic indentation disposed in the first substrate and a prismatic protrusion disposed on the second substrate, the indentation and the protrusion having inclined side surfaces, and the side surfaces of the indentation and the protrusion each forming the oblique surfaces. The first substrate rests with its recess on the prismatic protrusion of the second substrate, and the respective side surfaces rest flat on one another. The side surfaces of the protrusion are tilted toward one another, so that the substrates are aligned laterally and vertically with one another.

In accordance with a further feature of the invention, the second substrate is formed of a material having approximately the same coefficient of thermal expansion as the first substrate. Mechanical strains or stresses that could be caused by possible heating from the power loss after the two substrates have been joined, are averted by providing the two substrate materials with the same thermal expansion behavior. At the same time, a thermally caused misadjustment of the optical waveguide to the converter is prevented.

In accordance with an added feature of the invention, the optical waveguides are disposed in grooves in a lower surface of the first substrate, and their coupling-side end surfaces are flush with an oblique polished surface of the first substrate. Prefabricated optical waveguides can, for instance, be placed in such grooves. The optical waveguides are subsequently polished together with the polished surface, and end surfaces of the optical waveguides are created in an exactly defined beveling, from which light signals are totally reflected. The end surfaces can also be reflectively coated or provided with a protective coating, jointly with the polished surface.

In accordance with an additional feature of the invention, the optical waveguides each have another end surface, which is flush with a further polished surface of the first substrate. An optical coupling of the optical waveguides with further optical waveguides or with another converter is possible by way of these end surfaces. Since these optical waveguide end surfaces and the further polished surface are machined jointly, a suitable stop surface is created, at which a multichannel optical waveguide cable, for instance, can be coupled to the optical waveguides. The optical waveguides coupled to the converters on the substrates are mechanically separated from the optical waveguide cable. As a result, a mechanical stress on the coupling between the optical waveguide and the converter caused by possible tensile forces on the optical waveguide cable is averted.

In accordance with yet another feature of the invention, the first substrate has a guide device that is aligned parallel with the plane of the optical waveguides. That guide device serves, for instance, to align an optical waveguide plug with respect to the optical waveguides of the coupling component itself.

In accordance with a concomitant feature of the invention, the optical waveguides are formed by material, placed in grooves, that has an index of refraction which is higher than the index of refraction of the plastic or synthetic material of the first substrate. To that end, the material is first machined into the grooves and subsequently made to solidify. In a further step, both end surfaces, that is, of the oblique polished surface and of the further polished surface, are machined and polished.

Other features which are considered as characteristic for the invention are set forth in the appended claims.

Although the invention is illustrated and described herein as embodied in an electrooptical coupling component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
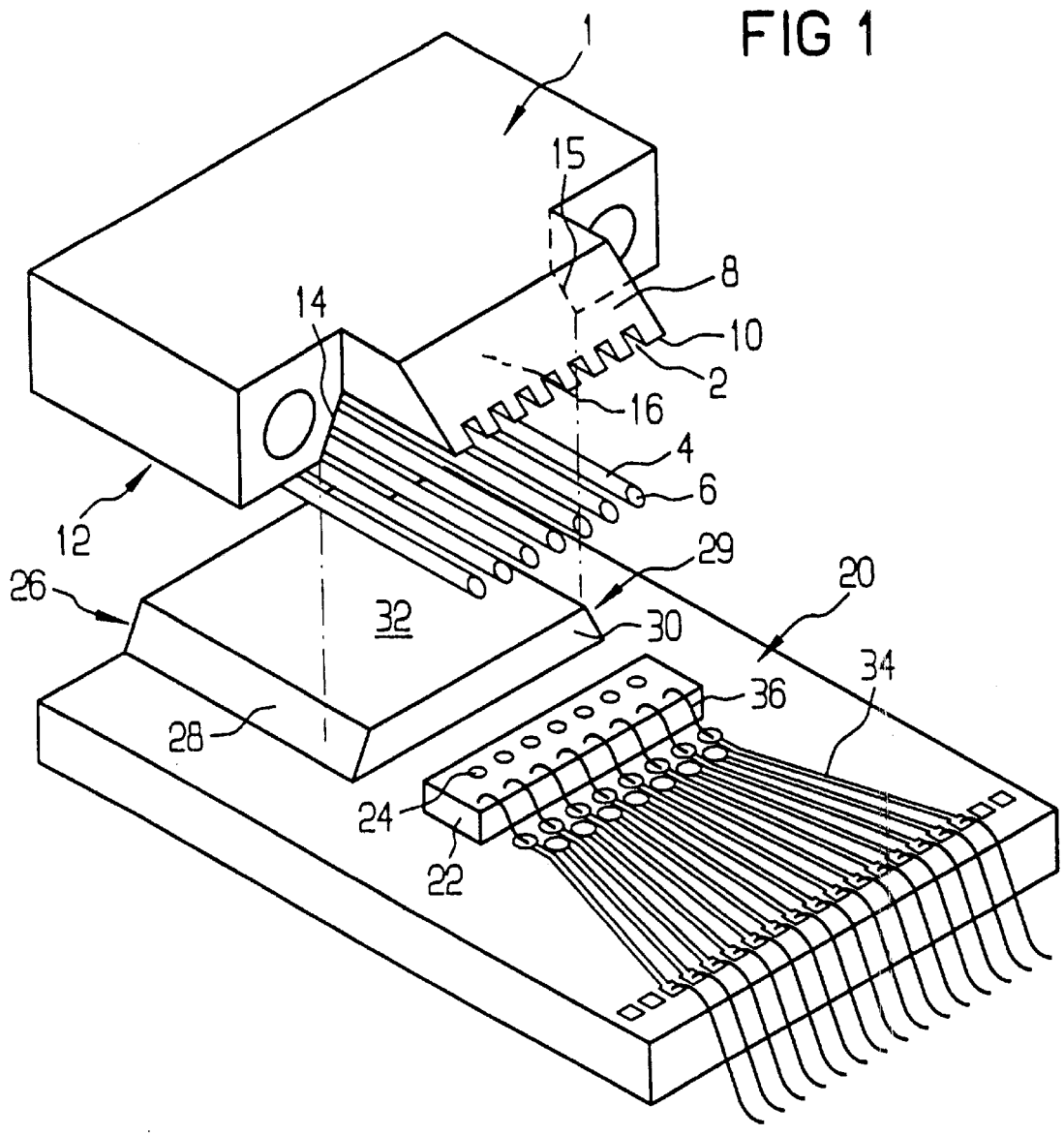
FIG. 1 is a diagrammatic, exploded perspective view of an electrooptical coupling component according to the invention.

Referring now to the figures of the drawings in detail and first, particularly, to FIG. 1 thereof, there is seen a coupling component that includes a first substrate 1 and a second substrate 20, in which the first substrate 1 is illustrated as being located above the second substrate 20. The first substrate 1 has a first alignment device 12 and the second substrate 20 has a second alignment device 26.

A symmetrical trapezoidal indentation 16 is recessed out of a plastic material of the first substrate 1 in a side facing toward the second substrate 20. The indentation 16 has a cross-sectional profile which is selected in such a way that inclined side surfaces 14, 15 thereof extend parallel to a lower surface 10 of the substrate 1 in one dimension, and the indentation 16 widens toward the substrate 20. Mutually parallel grooves 2 are formed in the lower surface 10 of the substrate 1 located in the indentation 16. These grooves 2 are aligned parallel with the side surfaces 14. Optical waveguides 4 are placed in these grooves in such a way that end surfaces 6 thereof facing toward a coupling are flush with an oblique polished surface 8. The inclined side surfaces 14, 15 are part of the first alignment device 12.

A symmetrical trapezoidal protrusion 30 is formed integrally on the second substrate 20. Side surfaces 28, 29 of the protrusion 30 are aligned in such a way that when joining the two substrates 1 and 20 together, the side surfaces 14, 15 of the indentation 16 rest flat on the side surfaces 28, 29 of the protrusion 30. The side surfaces 28, 29 are part of the second alignment device 26. The two substrates 1 and 20 are thereby aligned with one another. In the joined-together state of the two substrates 1 and 20, the optical waveguides 4 are located above a top plate 32 of the prismatic protrusion 30. As a result of the alignment of the two substrates 1 and 20 with one another, the coupling-side end surfaces 6 of the optical waveguides 4 are simultaneously aligned with optically active surfaces 24 of an electrooptical converter 22. The electrooptical converter 22 is disposed on the substrate 20 and is positioned relative to the inclined side surfaces or side walls 28 of the protrusion 30, for instance through the use of precise mechanical chip deposition. The converter 22 is premounted on a rear side of the substrate 20 and is electrically contacted through metallizings 34 and bond wires 36.

Due to the two-part construction of the coupling component, the converter 22 can be checked for operability before the two substrates 1 and 20 are mounted in final form. The same is true for the optical waveguides 4, which can be checked independently of the substrate 20, for instance for defects of material and processing, after having been placed in the grooves 2. Polishing of the end surfaces 6 toward the coupling of the optical waveguides 4, jointly with the oblique polished surface 8, is also advantageous. Once the optical waveguides 4 are fixed in the grooves 2, for instance by adhesive bonding, the end surfaces 6 can be simply machined.

An angle that the polished surface 8 forms with a longitudinal axis of the optical waveguides 4 is selected in such a way that a beam deflection is effected by total reflection from the end surfaces 6, and the optical waveguides 4 are optically coupled with the optically active surfaces 24 of the converter 22. In order to provide protection of the end surfaces 6, they may be provided with a protective layer or a reflective coating.

Figure 2:
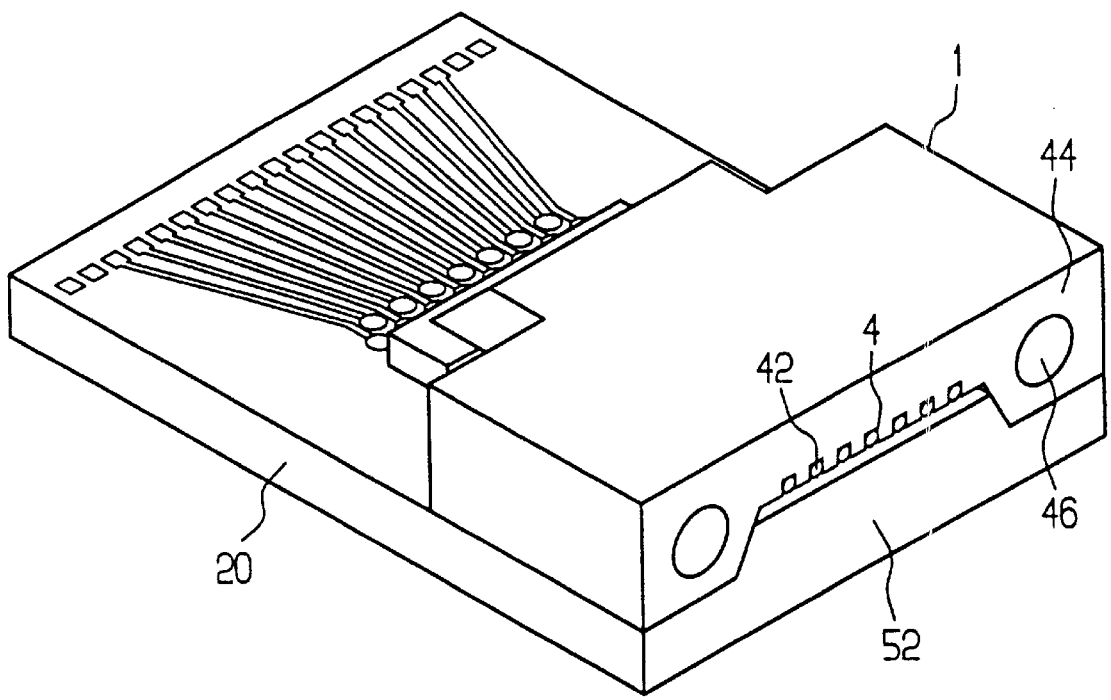
FIG. 2 is a perspective view of the coupling component in a joined-together state.

FIG. 2 shows the coupling component in the joined-together state. Once the two substrates 1 and 20 have been durably joined together through the use of an adhesive, the optical waveguides 4 are machined at a further polished surface 44 of the substrate 1. This creates end surfaces 42, which are flush with the polished surface 44. Simultaneously with the polishing of the optical waveguides 4, an end surface 52 of the substrate 20 is machined, so that the end surfaces 42, the polished surface 44 and the surface 52 are located in the same plane and form a common stop surface. Bores (guides) 46 are machined into the substrate 1, parallel to the optical waveguides 4, for alignment of a plug partner or counterpart plug. These bores 46 interact with non-illustrated alignment pins on the plug partner, and as a result optical waveguides or converter elements of the plug partner are aligned with respect to the end surfaces 42 of the optical waveguides 4. As a result, on one hand, an optical further signal conduction through the use of an optical waveguide cable is made possible, and on the other hand the coupling component can be checked for operability by being coupled to a receiver. At the same time, the coupling component can be inserted in modularly constructed signal devices, and in the event of a possible failure of one coupling component, it can simply be replaced with a new one.

We claim:

1. An electrooptical coupling component, comprising:

a first substrate formed as a molded synthetic-material body having a first alignment device formed by oblique surfaces;

a second substrate having a second alignment device matched to said first alignment device and formed by oblique surfaces corresponding to said oblique surfaces of said first alignment device;

a plurality of optical waveguides disposed in one given plane on said first substrate and having coupling-side end surfaces and longitudinal axes; and a multichannel electrooptical converter positioned on said second substrate independently of said optical waveguides and precisely relative to said second alignment device, said multichannel electrooptical converter having optically active surfaces oriented toward said coupling-side end surfaces of said optical waveguides;

said coupling-side end surfaces of said optical waveguides causing a beam deflection to said optically active surfaces of said multichannel electrooptical converter;

said oblique surfaces having one dimension extended parallel to said longitudinal axes of said optical waveguides, said oblique surfaces located in planes intersecting said given plane of said optical waveguides, and said oblique surfaces form-lockingly engaged with each other for laterally adjusting said end surfaces of said optical waveguides relative to said optically active surfaces of said multichannel electrooptical converter;

one of said first substrate and said second substrate having only one prismatic indentation formed therein, and the other of said first substrate and said second substrate having only one prismatic protrusion formed thereon, said indentation and said protrusion having inclined side surfaces forming said oblique surfaces.

2. The coupling component according to claim 1, wherein said second substrate is formed of a material having approximately the same coefficient of thermal expansion as said first substrate.

3. The coupling component according to claim 1, wherein said first substrate has a lower surface with grooves formed therein in which said optical waveguides are disposed, and said first substrate has an oblique polished surface flush with said coupling-side end surfaces.

4. The coupling component according to claim 3, wherein said first substrate has another polished surface, and said optical waveguides each have another end surface flush with said other polished surface.

5. The coupling component according to claim 1, wherein said first substrate has a polished surface, and said optical waveguides each have another end surface flush with said polished surface.

6. The coupling component according to claim 1, wherein said first substrate has a guide device aligned parallel with said given plane of said optical waveguides.

7. The coupling component according to claim 1, wherein said optical waveguides are formed by material placed in grooves, said material in said grooves having an index of refraction higher than an index of refraction of said synthetic material of said first substrate.

* * * * *